(12) United States Patent
Botula et al.

(10) Patent No.: US 9,070,651 B2
(45) Date of Patent: Jun. 30, 2015

(54) NON-LINEAR KERF MONITOR AND DESIGN STRUCTURE THEREOF

(75) Inventors: Alan B. Botula, Essex Junction, VT (US); Alvin J. Joseph, Williston, VT (US); Randy L. Wolf, Essex Junction, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 864 days.

(21) Appl. No.: 13/309,829

(22) Filed: Dec. 2, 2011

(65) Prior Publication Data

US 2013/0141114 A1     Jun. 6, 2013

(51) Int. Cl.
G06F 17/50 (2006.01)
H01L 27/06 (2006.01)
H01L 21/66 (2006.01)
G01R 31/28 (2006.01)

(52) U.S. Cl.
CPC ............ H01L 22/34 (2013.01); *G06F 17/5063* (2013.01); *H01L 27/0629* (2013.01); G01R 31/2884 (2013.01); *H01L 2924/0002* (2013.01)

(58) Field of Classification Search
CPC .......... G06F 17/5063; H01L 27/0629
USPC ............... 716/100, 118, 119, 136
See application file for complete search history.

(56) References Cited

U.S. PATENT DOCUMENTS

| | | | |
|---|---|---|---|
| 4,739,388 A | 4/1988 | Packeiser et al. | |
| 5,514,974 A | 5/1996 | Bouldin | |
| 6,486,685 B1 | 11/2002 | Hashimshony | |
| 7,183,788 B2 | 2/2007 | Moore | |
| 7,218,093 B2 | 5/2007 | Cirkel et al. | |
| 7,358,748 B1 | 4/2008 | Miller et al. | |
| 7,435,990 B2 * | 10/2008 | Keller et al. ............ | 257/48 |
| 7,514,949 B2 | 4/2009 | Kang et al. | |
| 7,643,957 B2 | 1/2010 | Daniel | |
| 7,724,012 B2 | 5/2010 | Marshall et al. | |
| 8,862,417 B2 * | 10/2014 | Chu et al. ............ | 702/81 |
| 2008/0206903 A1 | 8/2008 | Chan et al. | |
| 2011/0001504 A1 | 1/2011 | Cho et al. | |
| 2011/0018060 A1 | 1/2011 | Botula et al. | |

OTHER PUBLICATIONS

D. Lederer et al. "Effective resistivity of fully-processed SOI substrates", Solid-State Electronics 49, 2005, pp. 491-496.

* cited by examiner

*Primary Examiner* — Sun Lin
(74) *Attorney, Agent, or Firm* — Anthony Canale; Roberts Mlotkowski Safran & Cole, P.C.

(57) ABSTRACT

A non-linear kerf monitor, methods of manufacture and design structures are provided. The structure includes a coplanar waveguide provided in a kerf of a wafer between a first chip and a second chip. The structure further includes a shunt switch and a series switch coupled to the coplanar waveguide.

20 Claims, 9 Drawing Sheets

NON-LINEAR KERF MONITOR AND DESIGN STRUCTURE THEREOF

FIELD OF THE INVENTION

The invention relates to semiconductor structures and, more particularly, to a non-linear kerf monitor, and methods of manufacture and design structures thereof.

BACKGROUND

Processes using high resistive substrates (>50 Ohm-cm) need monitoring to ensure that a wafer meets design specifications and that an effective substrate resistance is maintained after fabrication without degrading the linear performance of active devices. Transmission lines, such as a coplanar waveguide, on a die are used as a monitor to determine whether the effective substrate resistance is maintained without degrading the linear performance of active devices. A coplanar waveguide (CPW) is formed from a conductor separated from a pair of ground planes all on the same plane, on a dielectric medium. The dielectric medium is thick enough so that electromagnetic fields fade out before they get out of the substrate. Active devices can be mounted on top of a circuit when using a CPW. More importantly, it can provide extremely high frequency response (100 GHz or more).

In addition, FET based switches are implemented in the die to study effects on the linear performance of the active devices. However, these monitors take up large amounts of die area. Furthermore, transmission lines placed on the die do not examine the non-linear performance of active devices, which is not known until their actual designs are tested. These monitors are tested using direct current (DC) and low frequency, e.g., 100 kilohertz, voltage supplies.

Accordingly, there exists a need in the art to overcome the deficiencies and limitations described hereinabove.

SUMMARY

In an aspect of the invention, a structure comprises a coplanar waveguide provided in a kerf of a wafer between a first chip and a second chip. The structure further comprises a shunt switch and a series switch coupled to the coplanar waveguide.

In an aspect of the invention, a method comprises applying a gate bias to a shunt switch and a series switch, both coupled to a coplanar waveguide within a kerf space. The method further comprises injecting an RF power into one end of the shunt switch and one end of the series switch. The method also comprises measuring a fundamental power and a harmonic power at a load resistor of the shunt switch and a second load resistor of the series switch, while increasing the RF power.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the non-linear kerf monitor, which comprises the structures of the present invention. In still further embodiments, a method in a computer-aided design system is provided for generating a functional design model of the non-linear kerf monitor. The method comprises generating a functional representation of the structural elements of the non-linear kerf monitor.

In more specific aspects of the invention, a design structure tangibly embodied in a machine readable medium for designing, manufacturing, or testing an integrated circuit, the design structure comprises a coplanar waveguide provided in a kerf of a wafer between a first chip and a second chip. The design structure further comprises a shunt switch and a series switch coupled to the coplanar waveguide.

BRIEF DESCRIPTION OF THE SEVERAL VIEWS OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION

The invention relates to semiconductor structures and more particularly, to a non-linear kerf monitor, and methods of manufacture and design structures thereof. In embodiments, the non-linear kerf monitor includes a shunt switch and a series switch coupled to a coplanar waveguide. Advantageously, the shunt switch and the series switch measure the non-linear properties of the substrate. These structures have been designed to be implemented within the kerf structure. Consequently, the present invention removes the structures from the chip itself, thereby creating additional space for the placement of additional active or passive devices on the chip. Furthermore, the structures are designed to permit a single tester to determine the quality of a finished wafer on a pass/fail basis before being delivered to consumers, thus preventing manufacturing delays and returned products. The present invention also provides for increased test flexibility which makes testing more cost-effective.

In an illustrative example, the shunt switch includes an RF signal generator connected to a load resistor RL and ground GND. The RF signal generator is also connected to set of stacked FETs. In particular, the RF signal generator is connected to a source of a first FET in the stack. Drains of the FETs are connected to a source of the subsequent FET in the stack, and the drain of a last FET in the stack is connected to ground GND. Gates of the FETs are connected to resistors and, as a result, the gates are isolated from each other. The resistors are coupled to a gate bias, and the shunt switch is biased to achieve gate depletion.

On the other hand, the series switch includes an RF signal generator connected to a set of stacked FETs and ground GND. The RF signal generator is connected to a source of a first FET, and drains of the FETs are connected to a source of the subsequent FET in the stack. However, the drain of a last FET of the stack is connected to a load resistor. Gates of the FETs are connected to resistors and, as a result, the gates are isolated from each other. The resistors are coupled to a gate bias, and the series switch is biased to achieve gate inversion.

Figure 1:
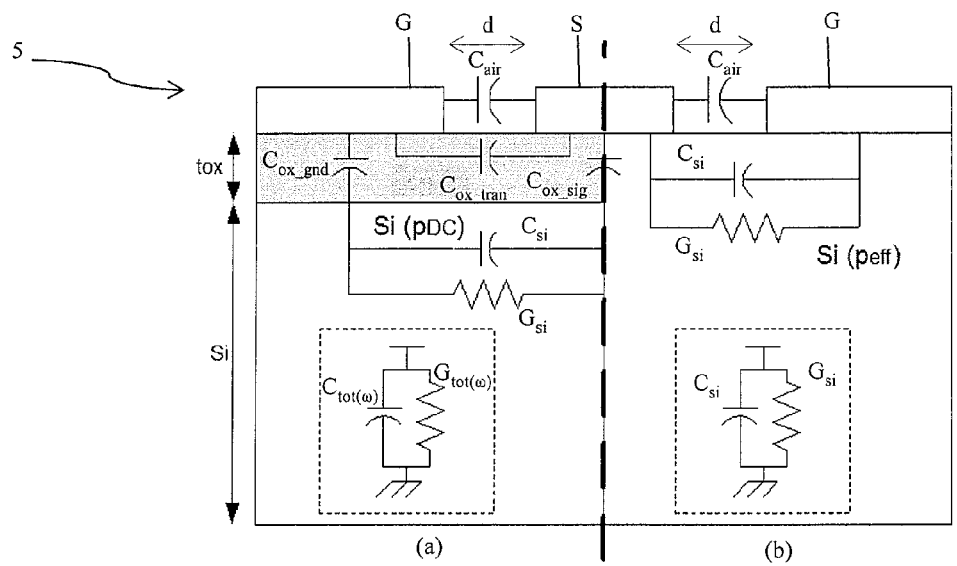
FIG. 1 shows a cross-section view of a coplanar waveguide according to aspects of the invention.

FIG. 1 shows a cross-section view of a coplanar waveguide (CPW) according to aspects of the invention. More specifically, the CPW 5 includes a signal line S separated from a pair of ground lines G by a distance d, with the distance d having the capacitance $C_{air}$. The signal line S and the ground lines G are all on the same plane, on a dielectric medium. In embodiments, the signal line S and the ground lines G, may be a metal, such as aluminum (Al). FIG. 1 also shows the CPW 5 on a passivated silicon (Si) substrate (a). The passivated Si substrate (a) includes a thin oxide layer $t_{ox}$ and a Si layer. The oxide layer $t_{ox}$ has a capacitance due to several factors including: (i) the capacitance of the ground line $C_{ox\_gnd}$, (ii) the capacitance of the transmission line between the signal line S and ground lines G $C_{ox\_tran}$, and (iii) the capacitance of the signal line $C_{ox\_sig}$. The Si layer includes the capacitance of the Si, $C_{si}$, and the conductance of the Si, $G_{si}$. As such, the passivated Si substrate (a) is equivalent to an RC network having a capacitance of $C_{tot(\omega)}$ which includes $C_{ox\_gnd}$, $C_{ox\_tran}$, $C_{ox\_sig}$, and $C_{si}$, and a conductance $G_{tot(\omega)}$. When operating at lower frequencies, the capacitances, $C_{ox\_gnd}$ and $C_{ox\_tran}$, of the oxide layer $t_{ox}$ dominate the RC network creating a short circuit, which adversely affects the effective substrate resistance. The passivated Si substrate (a) has an effective substrate resistance $\rho_{DC}$.

FIG. 1 also shows a CPW 5 on an effective homogenous substrate (b) used for effective substrate resistance modeling. When operating at higher frequencies, the passivated Si substrate (a) is mapped into the homogenous substrate (b). The homogenous substrate (b) has a capacitance $C_{si}$ and conductance $G_{si}$, which are the capacitance and conductance of the silicon substrate, respectively. As such, the homogenous substrate (b) is equivalent to an RC network having a capacitance of $C_{si}$ and a conductance $G_{si}$. The homogenous substrate (b) has an effective substrate resistance $\rho_{eff}$.

Equation 1 is provided for calculating the effective substrate resistance of silicon. The effective substrate resistance $\rho_{eff}$ is measured in Ohms-cm.

$$\rho_{eff} = \frac{1}{\sqrt{\epsilon_{r,eff}}} \left( \frac{\epsilon_{r,eff} - 1}{\epsilon_{r,Si} - 1} \right) \frac{\sqrt{C_0}}{\epsilon_0} \frac{\sqrt{C_{tot}}}{G_{tot}} \quad (1)$$

In the equation, $C_{tot}$ and $G_{tot}$ represent the total capacitance and conductance, respectively, of the substrate, and are calculated using S-parameters. The S-parameters are calculated using a 2×2 matrix for each frequency. In addition, the effective dielectric constant $\epsilon_{r,eff}$ and the effective dielectric constant of silicon $\epsilon_{r,si}$ are calculated using S-parameters. Furthermore, $\epsilon_o$ is the permittivity of free space and $C_o$ is the capacitance/mm of the CPW structure in air. It should be understood by those having ordinary skill in the art known that the equation can be utilized for any substrate material. For example silicon-germanium could be utilized, and thus, the dielectric constant of SiGe would be utilized, and $C_{tot}$ and $G_{tot}$ would be the capacitance and conductance of SiGe.

Figure 2A:
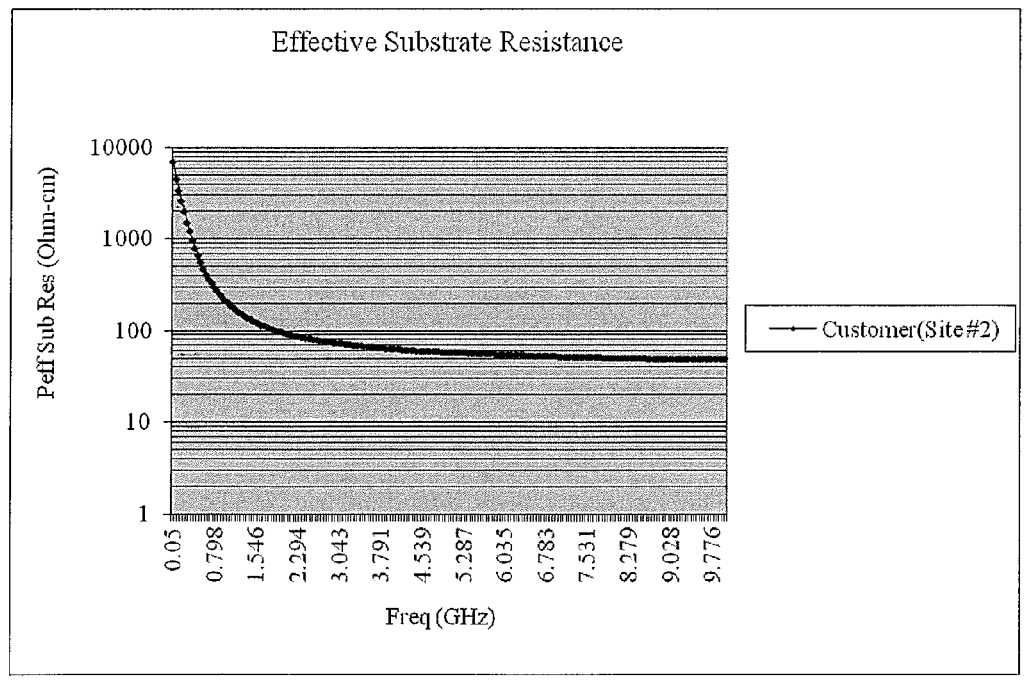
FIG. 2A shows a graph of an effective substrate resistance of a passivated silicon substrate according to aspects of the invention.

FIG. 2A shows a graph of the effective substrate resistance of a passivated silicon substrate according to aspects of the invention. In FIG. 2A, the x-axis represents operating frequencies in GHz and the y-axis represents the effective substrate resistance in Ohm-cm. As discussed with respect to FIG. 1, when operating at lower frequencies, the capacitances of the oxide layer dominate the RC network creating a short circuit, which adversely affects the effective substrate resistance. The graph in FIG. 2A shows that at a frequency of about 2.5-3 GHz, the effective substrate resistance drops to about 50-60 Ohm-cm as a result of the short circuit created by $C_{ox\_gnd}$ and $C_{ox\_tran}$, which is a poor effective substrate resistance.

Figure 2B:
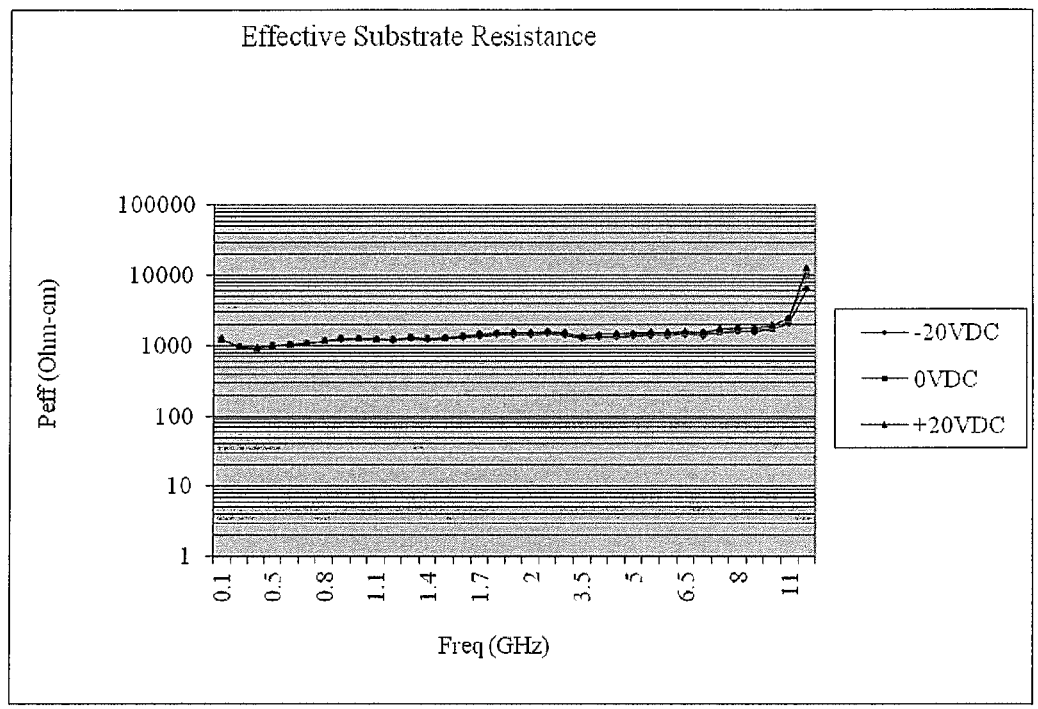
FIG. 2B shows a graph of an effective substrate resistance of an effective homogenous substrate according to aspects of the invention.

FIG. 2B shows a graph of the effective substrate resistance of an effective homogenous substrate according to aspects of the invention. In FIG. 2B, the x-axis represents operating frequencies in GHz and the y-axis represents the effective substrate resistance in Ohm-cm. As discussed with respect to FIG. 1, when operating at higher frequencies, the passivated Si substrate is mapped into the homogenous substrate. The graph in FIG. 2B shows at frequencies up to about 11 GHz the effective substrate resistance is about 1000 Ohm-cm, which is an excellent effective substrate resistance.

Figure 3:
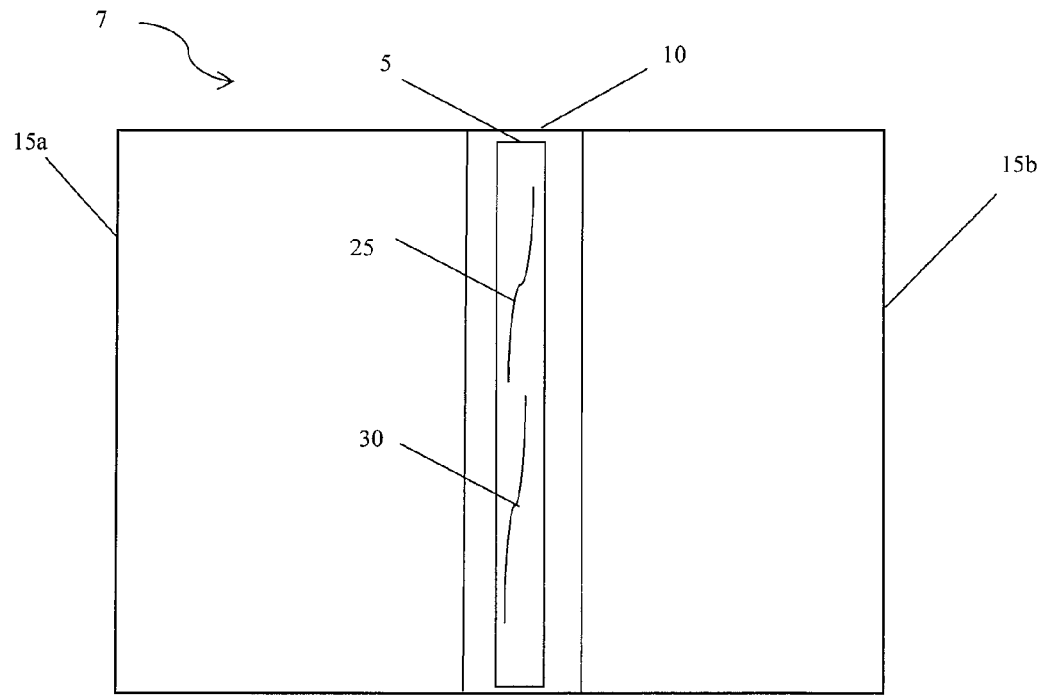
FIG. 3 shows a highly schematic representation of a coplanar waveguide implemented in a kerf of a wafer.

FIG. 3 shows a highly schematic representation of a CPW according to aspects of the invention. More specifically, FIG. 3 shows a wafer 7 having a kerf 10 between a first chip 15a and a second chip 15b. FIG. 3 further shows a CPW 5 implemented in the kerf 10. The CPW 5 is coupled to a substrate of the wafer 7 via metal contacts. In embodiments, the substrate is a silicon on insulator (SOI) substrate. In embodiments, crystal structure regions, e.g., damaged crystal structure regions, are formed at an interface of an insulator layer, e.g., SiO$_2$ and the supporting substrate. The crystal structure regions reduce harmonics of the supporting substrate. The use of damaged crystal structure regions are disclosed in U.S. Publication No. 2011/0018060, which is herein incorporated by reference in its entirety.

The CPW 5 includes a shunt switch 25 and a series switch 30, discussed in further detail below. The width of the kerf 10 is narrower than the space allocated for a CPW 5 on chips 15a, 15b. For example, the CPW 5 is implemented in the kerf 10 having a width of about 18 μm; whereas, the CPW 5 implemented in a portion of a chip 15a, 15b had a width of 28 μm. As such, the CPW 5 of the present invention provides for unique configurations of monitoring the CPW 5 in order to fit within the spatial limitations of the kerf 10, while maintaining desired characteristic impedance, e.g., 50 Ohms, which is the impedance of radio frequency (RF) devices.

In particular, the distance between the signal line S and the ground lines G, as discussed with respect to FIG. 1, is smaller because of the fixed width of the kerf 10. As a result of the fixed width, the vertical capacitance to the substrate is fixed and dominates the CPW 5. In embodiments, to compensate for the vertical capacitance, the signal line S is narrowed, the ground lines G are widened, or a combination of both. In doing so, the present invention advantageously provides more coupling to the substrate.

Figure 4:
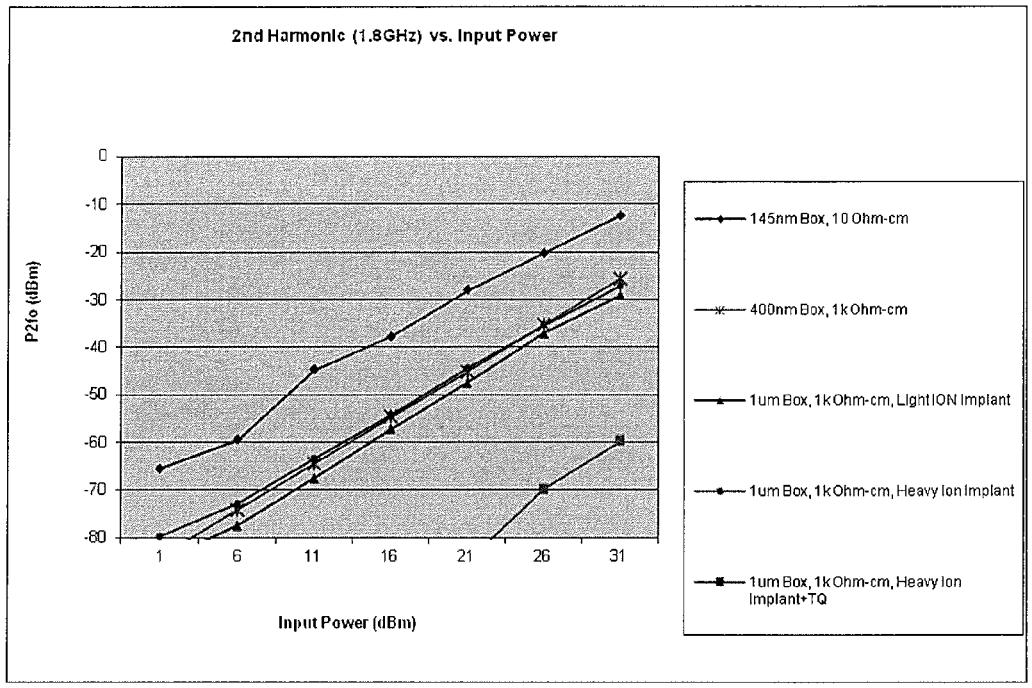
FIGS. 4 and 5 show performance graphs of the coplanar waveguide according to aspects of the invention.
Figure 5:
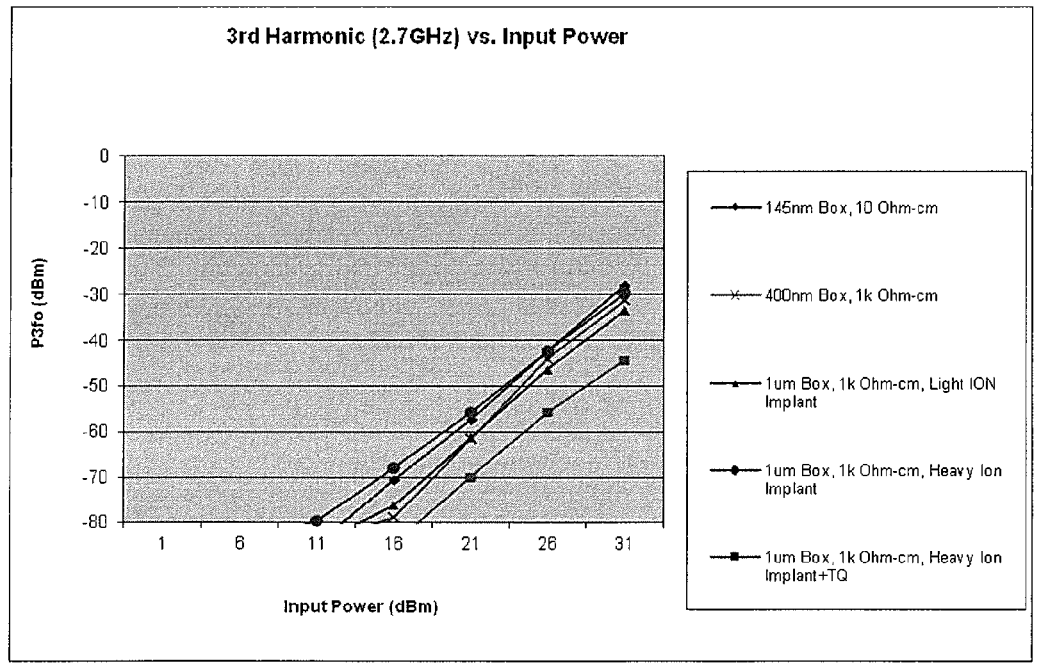

FIGS. 4 and 5 show performance graphs of the CPW according to aspects of the invention. In FIGS. 4 and 5, the x-axis represents the power input and the y-axis represents the second and third harmonics, respectively, of the CPW. To measure the harmonics, a fundamental frequency is injected in one end of the CPW and the fundamental frequency and its harmonic power in decibels (dBm) are measured while increasing an input power. In theory, a CPW does not produce harmonics; however, a CPW generates harmonics when coupled to a substrate which generates harmonic tones. The graphs of FIGS. 4 and 5 show the harmonic performance of five different substrates. For example, FIGS. 4 and 5 show the harmonic performance of a 145 nm BOX with a substrate resistance of 10 Ohm-cm.

In FIG. 4, a fundamental frequency of 900 MHz was injected and the second harmonics at 1.8 GHz were measured. It should be understood by those having ordinary skill in the art known that a fundamental frequency of 900 MHz is for exemplary purposes, and the harmonics may be measured with any fundamental frequency. FIG. 4 shows the CPW generates second harmonics at an input power of about 1 dBm and shows a linear increase up to an input power of about 31 dBm.

In FIG. 5, a fundamental frequency of 900 MHz was injected, and the third harmonics at 2.7 GHz were measured. It should be understood by those having ordinary skill in the art known that a fundamental frequency of 900 MHz is for exemplary purposes, and the harmonics may be measured with any fundamental frequency. FIG. 5 shows the CPW generates third harmonics at an input power of about 8 dBm and shows a linear increase up to an input power of about 31 dBm.

Figure 6A:
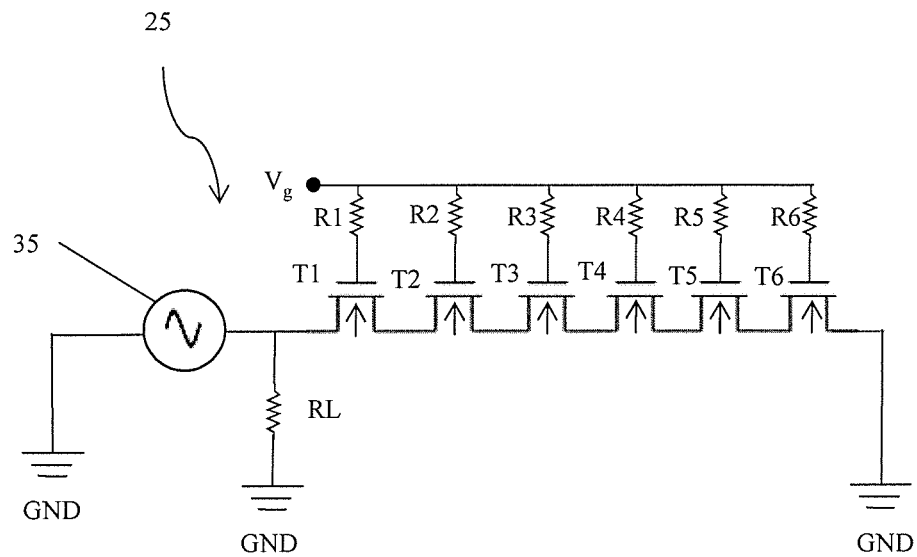
FIG. 6A shows a schematic of a shunt switch according to aspects of the invention.

FIG. 6A shows a schematic of a shunt switch according to aspects of the invention. As should be understood, FETs of the shunt switch 25 will be located in the kerf as represented in FIG. 3, which provides for unique and unexpected considerations due to its size and spacing limitations. More specifically, FIG. 6A shows a shunt switch 25 having an RF signal generator 35 connected to a load resistor RL and ground GND. In embodiments, the RF signal generator 35 operates at a frequency of 1 GHz and has an amplitude of 10V, and the load resistor RL has a resistance of 50 ohms. The RF signal generator 35 is also connected to a set of stacked FETs T1-T6. In embodiments, six FETs are utilized because they are sufficiently large enough to withstand the power of the RF signal generator 35 without exceeding the spatial limitations of the kerf. Furthermore, the use of six FETs generates more harmonics compared to the use of additional FETs, which consequently makes it easier to measure the shunt switch 25. In embodiments, the FET stack has a width of 5 µm, in order to fit within the kerf, providing unique considerations and advantages as described herein.

More specifically, FIG. 6A shows the RF signal generator 35 connected to a source of the first FET T1. Drains of the FETs T1-T5 are connected to a source of the subsequent FET in the stack, i.e., the drain of FET T1 is connected to the source of FET T2, the drain of FET T2 is connected to the source of FET T3, etc. At the end of the stack, the drain of the FET T6 is connected to ground. Gates of the FETs T1-T6 are connected to resistors R1-R6, respectively, and as a result, the gates are isolated from each other. In embodiments, the gates of the FETs in the shunt switch 25 have a width of 4 µm. With a gate width of 4 µm, the shunt switch 25 generates harmonics without exceeding the spatial limitations of the kerf. In embodiments, the resistors R1-R6 have a resistance of 10 ohms. The resistors R1-R6 are coupled to a gate bias $V_g$, and the shunt switch 25 is biased to achieve gate depletion. In operation, the RF signal generator 35 injects RF power into one end of the FET stack, and the fundamental and harmonic power is measured at the load resistor RL; however, the shunt switch 25 is measured in an off state.

Figure 6B:
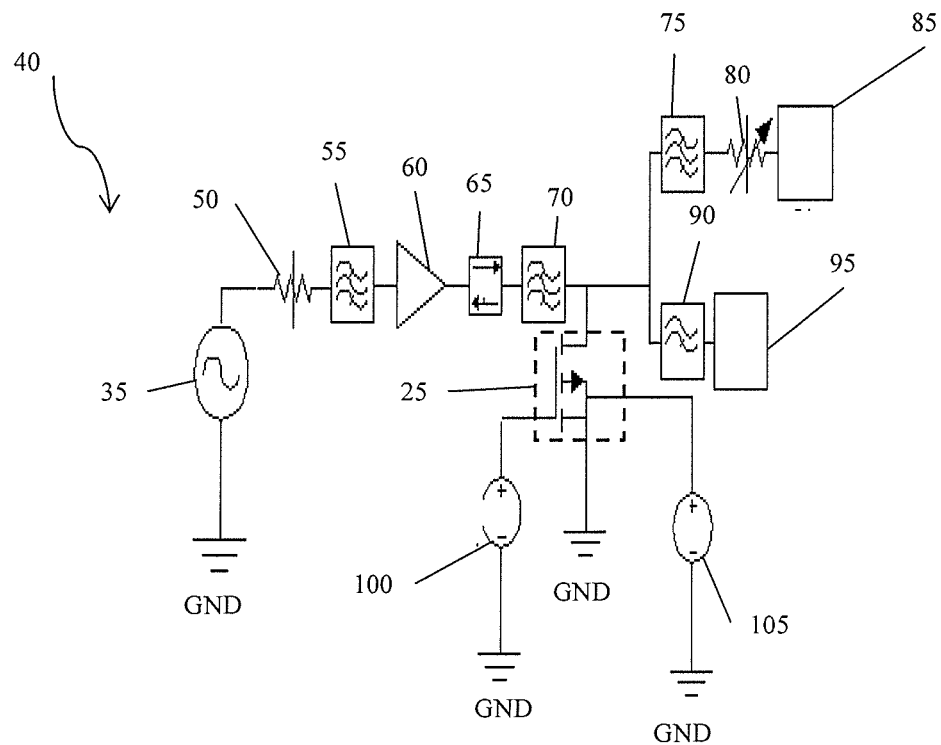
FIG. 6B shows a schematic of a circuit implementing the shunt switch of FIG. 6A according to aspects of the invention.

FIG. 6B shows a schematic of a circuit implementing the shunt switch of FIG. 6A according to aspects of the invention. More specifically, FIG. 6B shows a test circuit 40 for testing the harmonics of the shunt switch 25. The test circuit 40 includes a RF signal generator 35 connected to an attenuator 50, which, in turn is connected to a first bandpass filter 55. The first bandpass filter 55 is then connected to an amplifier 60, and an output of the amplifier is connected to an isolator 65. The isolator 65 is connected to a second bandpass filter 70. The second bandpass filter 70 is then connected to a source of the FET shunt switch 25. The second bandpass filter 70 is also connected to a first frequency selector 75 which is connected to a second attenuator 80. The second attenuator 80 is connected to a first spectrum analyzer 85. The second bandpass filter is further connected to a second frequency selector 90. The second frequency selector 90 is connected to a second spectrum analyzer 95. In embodiments, the test circuit 40 is located outside the kerf 10.

The shunt switch 25 is connected to a first DC voltage supply 100, a second voltage supply 105, and ground GND. More specifically, the first voltage supply 100 is connected to a gate of the shunt switch 25 and the second voltage supply 105 is connected to a body of the shunt switch 25. A drain of the shunt switch 25 is connected to ground GND. In embodiments, the voltage of the first voltage supply 100 is −2.5V and the voltage of the second voltage supply 105 is −2.0V. Both the first voltage supply 100 and the second voltage supply 105 serve as probes for providing a DC bias. However, the second voltage supply 105 is a body contact only.

Figure 7A:
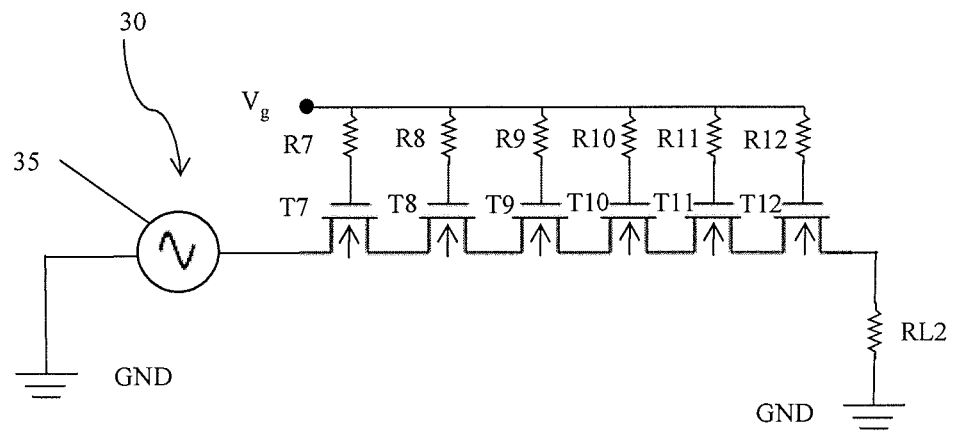
FIG. 7A shows a schematic of a series switch according to aspects of the invention.

FIG. 7A shows a schematic of a series switch 30 according to aspects of the invention. As should be understood, FETS of the series switch 30 will be located in the kerf as represented in FIG. 3, which provides for unique and unexpected considerations due to its size and spacing limitations. Similar to the shunt switch of FIG. 6A, in the series switch 30, an RF signal generator 35 is connected to a set of stacked FETs T7-T12; however, in the series switch 30 a load resistor RL2 is connected to a drain of the last FET of the stack, e.g., transistor T12. More specifically, FIG. 7A shows an RF signal generator 35 connected to a set of stacked FETs T7-T12 and ground GND. In embodiments, the RF signal generator 35 operates at a frequency of 1 GHz and has an amplitude of 10V. In embodiments, six FETs are used because they are sufficiently large enough to withstand the power of the RF signal generator 35 without exceeding the spatial limitations of the kerf 10. In embodiments, the FETs of the series switch have a gate width of 1 µm. The narrower gate width of the series switch 30 increases coupling to the substrate which increases the sensitivity of the harmonics. In addition, the FET stack has a width of 5 µm, in order to fit within the kerf, providing unique considerations and advantages as described herein.

More specifically, FIG. 7A shows the RF signal generator 35 is connected to a source of the first FET T7. Drains of the FETs T7-T11 are connected to a source of the subsequent FET in the stack, i.e., the drain of FET T7 is connected to the source of FET T8, the drain of FET T8 is connected to the source of FET T9, etc. At the end of the stack, the drain of the FET T12 is connected to a load resistor RL2. In embodiments, the load resistor RL2 has a resistance of 50 ohms. Gates of the FETs T7-T12 are connected to resistors R7-R12, respectively, and as a result, the gates are isolated from each other. In embodiments, the resistors R7-R12 have a resistance of 10 ohms. The resistors R7-R12 are coupled to a gate bias $V_g$, and the series switch 30 is biased to achieve gate inversion. In operation, the RF signal generator 35 injects RF power into one end of the FET stack, and the fundamental and harmonic power is measured at the load resistor RL2; however, the series switch is measured in an on state.

Figure 7B:
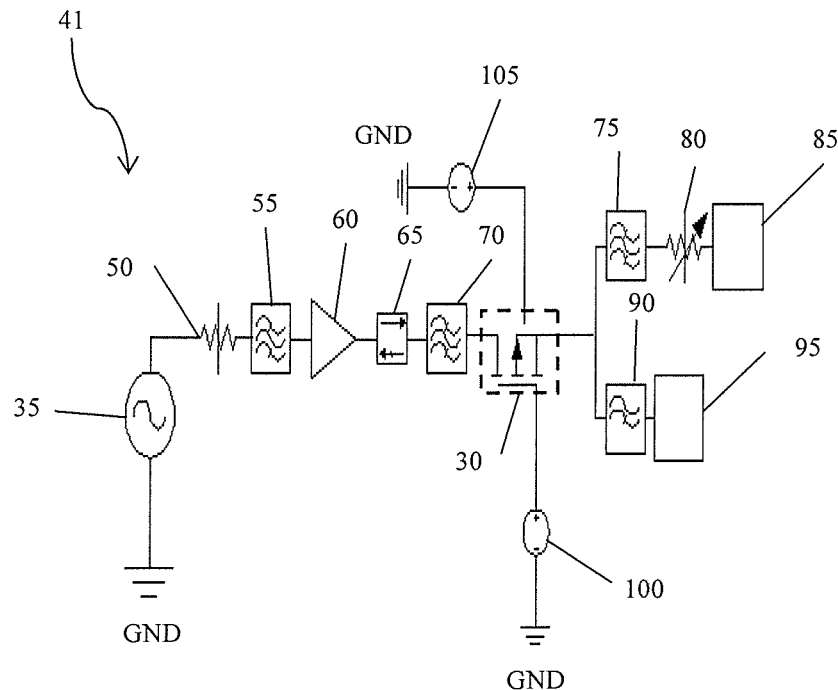
FIG. 7B shows a schematic of a circuit implementing the series switch of FIG. 7A according to aspects of the invention.

FIG. 7B shows a schematic of a circuit implementing the series switch of FIG. 7A according to aspects of the invention. More specifically, FIG. 7B shows a test circuit 41 for the series switch 30. In the test circuit 41, the second bandpass filter 70 is connected to the series switch 30, and the series switch is connected to the first frequency selector 75 and the second frequency selector 90. The test circuit 41 includes a RF signal generator 35 connected to an attenuator 50, which, in turn is connected to a first bandpass filter 55. The first bandpass filter 55 is then connected to an amplifier 60, and an output of the amplifier is connected to an isolator 65. The isolator 65 is connected to a second bandpass filter 70. The second bandpass filter 70 is then connected to the FET series switch 30. The body of the series switch 30 is connected to a first frequency selector 75 which is connected to a second attenuator 80. The second attenuator 80 is connected to a first spectrum analyzer 85. The body of the series switch 30 is further connected to a second frequency selector 90. The second frequency selector 90 is connected to a second spectrum analyzer 95. In embodiments, the test circuit 41 is located outside the kerf 10.

The series switch 30 is connected to a first DC voltage supply 100 and a second voltage supply 105. More specifically, the first voltage supply 100 is connected to a gate of the series switch 30 and the second voltage supply 105 is connected to the body of the series switch 30. In embodiments, the voltage of the first voltage supply 100 is −2.5V and the voltage of the second voltage supply 105 is −2.0V. Both the first voltage supply 100 and the second voltage supply 105 serve as probes for providing a DC bias. However, the second voltage supply 105 is a body contact only. The series switch is tested in an on state.

Figure 8:
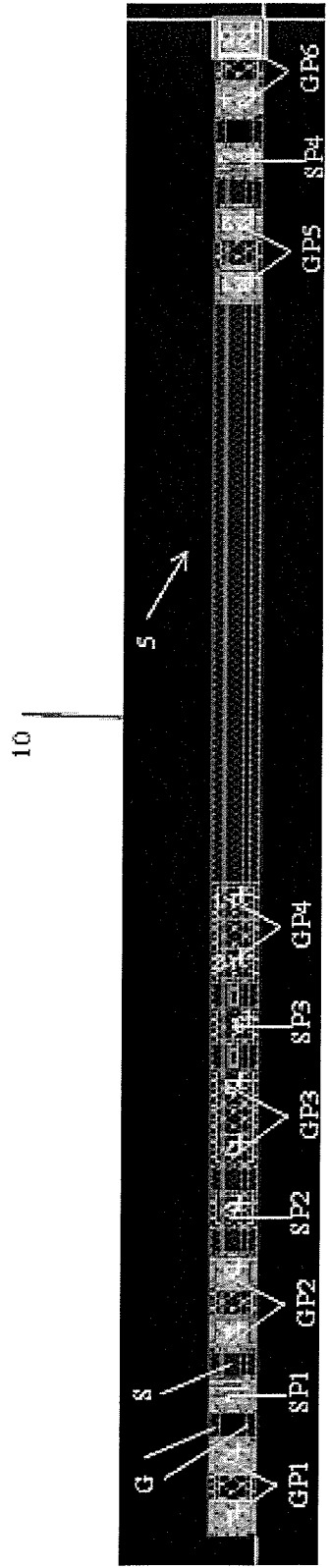
FIG. 8 shows a design layout of a coplanar waveguide according to aspects of the invention.

FIG. 8 shows a design layout of a CPW according to aspects of the invention. More specifically, FIG. 8 shows a CPW 5 implemented in a kerf 10. The CPW 5 includes a signal line S and two ground lines G. In embodiments, the CPW 5 has a length of about 2500 μm. In embodiments, the signal line S on a first wiring layer is connected to signal pads SP1-4 on a second wiring layer. In addition, the ground lines G on a first wiring layer are connected to ground pads GP1-6. In embodiments, two pads are used to form the ground pads GP-1-6 to allow 100 μm and 200 μm pitch probes to be used in measuring the non-linear performance of the substrate, which increases test flexibility. As a result of the increased test flexibility, testing is more cost effective because less expensive test probes can be utilized. In embodiments, the pads have dimensions of about 60 μm by 56 μm.

Figure 9:
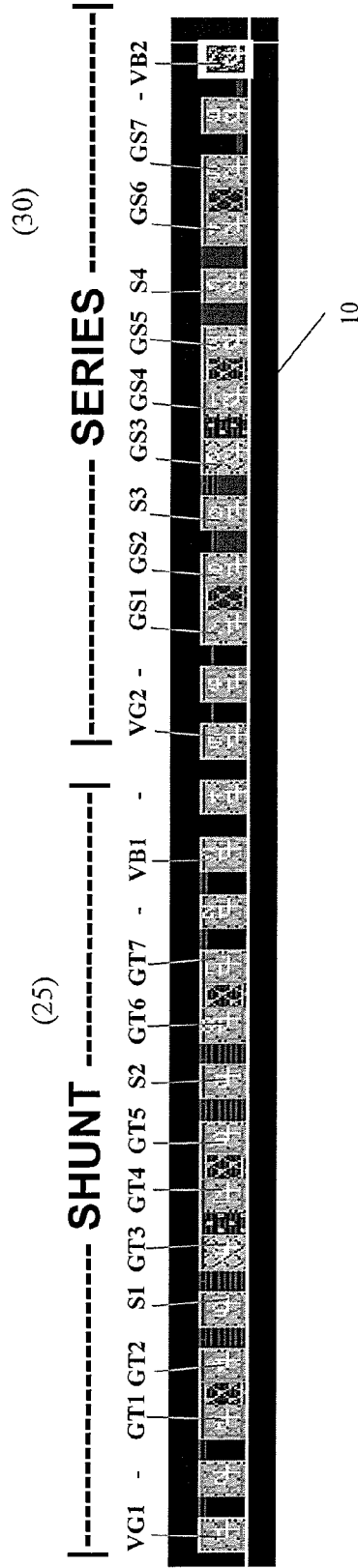
FIG. 9 shows a design layout of the shunt and series switches implemented in a kerf according to aspects of the invention.

FIG. 9 shows a design layout of the shunt switch and series switch implemented in a CPW according to aspects of the invention. In particular, FIG. 9 shows a pad layout and assignment for the shunt switch 25 and series switch 30 implemented in the kerf 10. In embodiments, the CPW 5 has a length of about 2660 μm. In FIG. 9, the shunt switch 25 layout includes a pad for a gate bias VG1 which turns the FET stack in the shunt switch 25 on and off. The layout further includes two ground pads GT1 and GT2 which separate the gate bias VG1 and a pad for the RF input Si to the shunt switch 25. The shunt switch 25 layout further includes three ground pads GT3-GT5 which separate the RF input S1 from a pad for the RF output S2. In embodiments, the RF output S2 is shorted to the RF input S1. The layout further includes two ground pads GT6 and GT7 which separate the RF output S2 from a pad for the body bias VB1.

In FIG. 9, the series switch 30 layout includes a pad for a gate bias VG2 which turns the FET stack in the series switch 30 on and off. The layout further includes two ground pads GS1 and GS2 which separate the gate bias VG2 and a pad for the RF input S3 to the series switch 30. The series switch layout further includes three ground pads GS3-GS5 which separate the RF input S3 from a pad for the RF output S4. The layout further includes two ground pads GS6 and GS7 which separate the RF output S4 from a pad for the body bias VB2.

Figure 10:
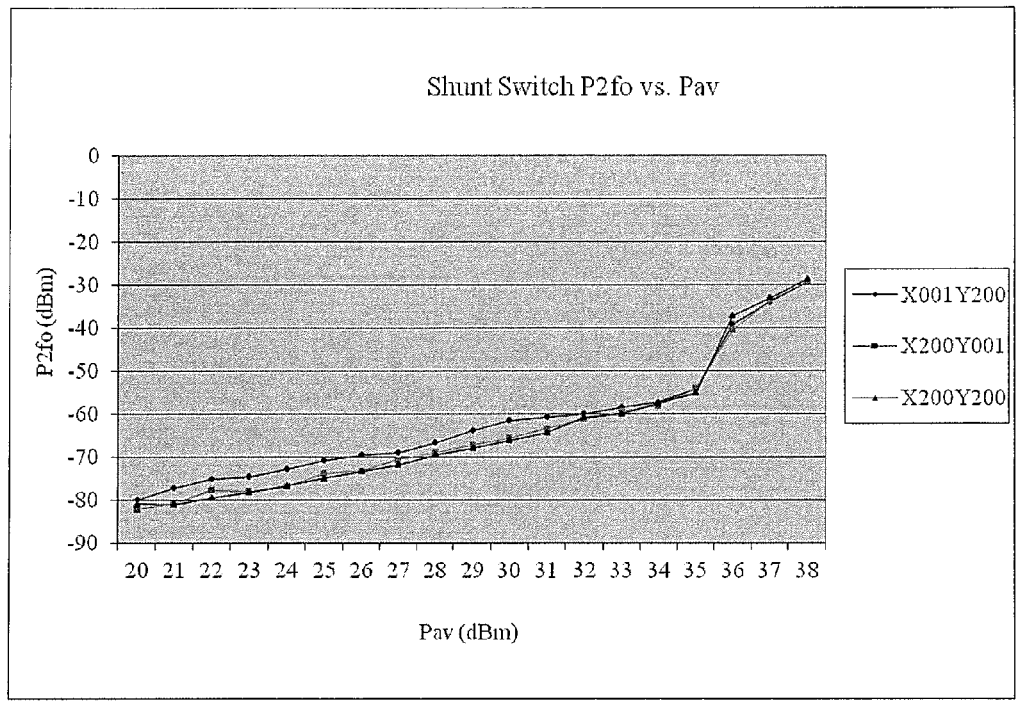
FIGS. 10 and 11 show performance graphs of the shunt switch according to aspects of the invention.
Figure 11:
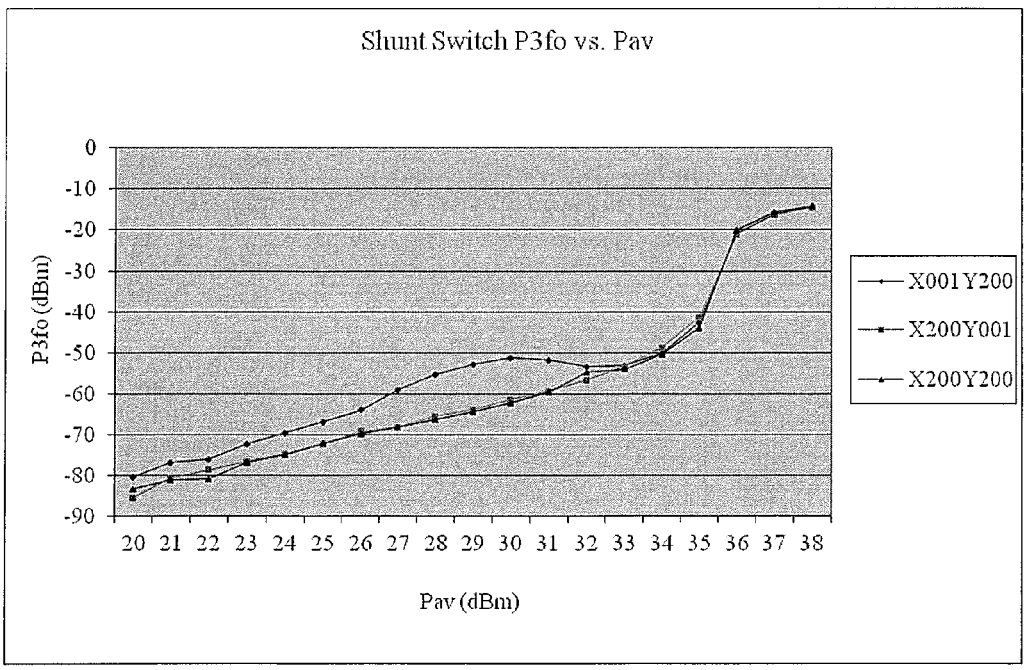

FIGS. 10 and 11 show performance graphs of the shunt switch according to aspects of the invention. To measure the performance of the shunt switch, a RF input power is injected into one of the stack, and the fundamental and harmonic power is measured at the load resistor. In FIGS. 10 and 11, the x-axis represents the power input and the y-axis represents the second and third harmonics, respectively, of the shunt switch. In FIG. 10, the shunt switch produces second harmonics at a power input of about 20 dBm. FIG. 10 further shows the second harmonics jump at an input power of about 35 dBm. As such, the harmonics produced by the shunt switch indicate a functional substrate. However, if the shunt switch does not produce harmonics, it would indicate that the substrate is defective. Accordingly, utilizing the shunt switch detects defective substrates prior to being delivered to a client, thus preventing manufacturing delays and returned products, and also provides additional space on the chip.

Similarly, in FIG. 11, the shunt switch produces third harmonics at an input power of about 20 dBm. FIG. 11 further shows the third harmonics jump at an input power of about 35 dBm. As such, the harmonics produced by the shunt switch indicate a functional substrate. However, if the shunt switch does not produce harmonics, it would indicate that the substrate is defective. Accordingly, utilizing the shunt switch detects defective substrates prior to being delivered to a client, thus preventing manufacturing delays and returned products, and also provides additional space on the chip.

Figure 12:
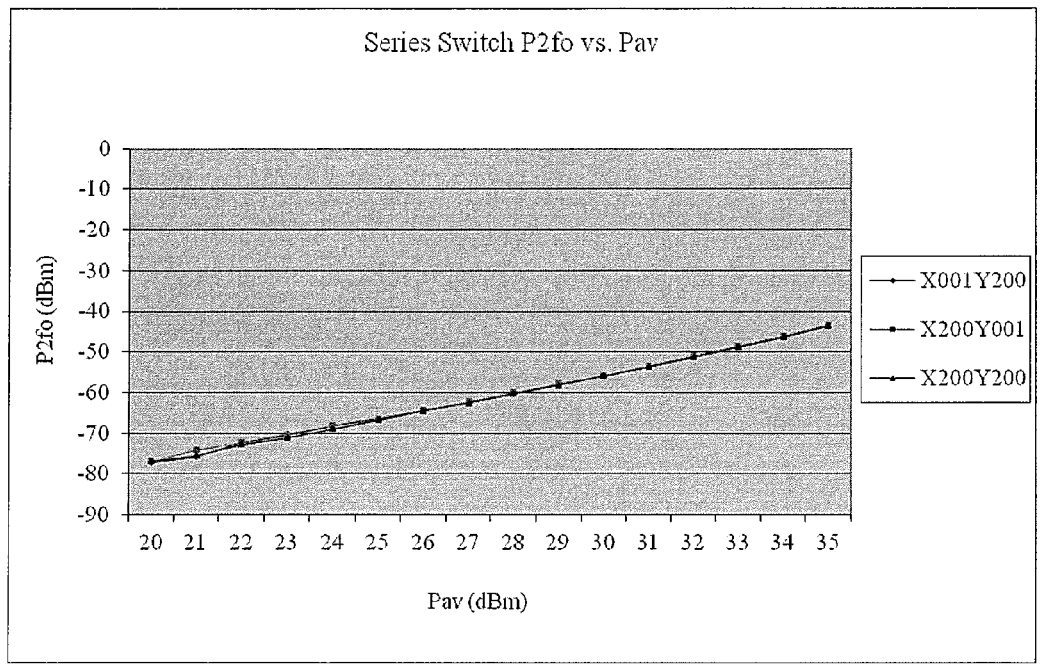
FIGS. 12 and 13 show performance graphs of the series switch according to aspects of the invention.
Figure 13:
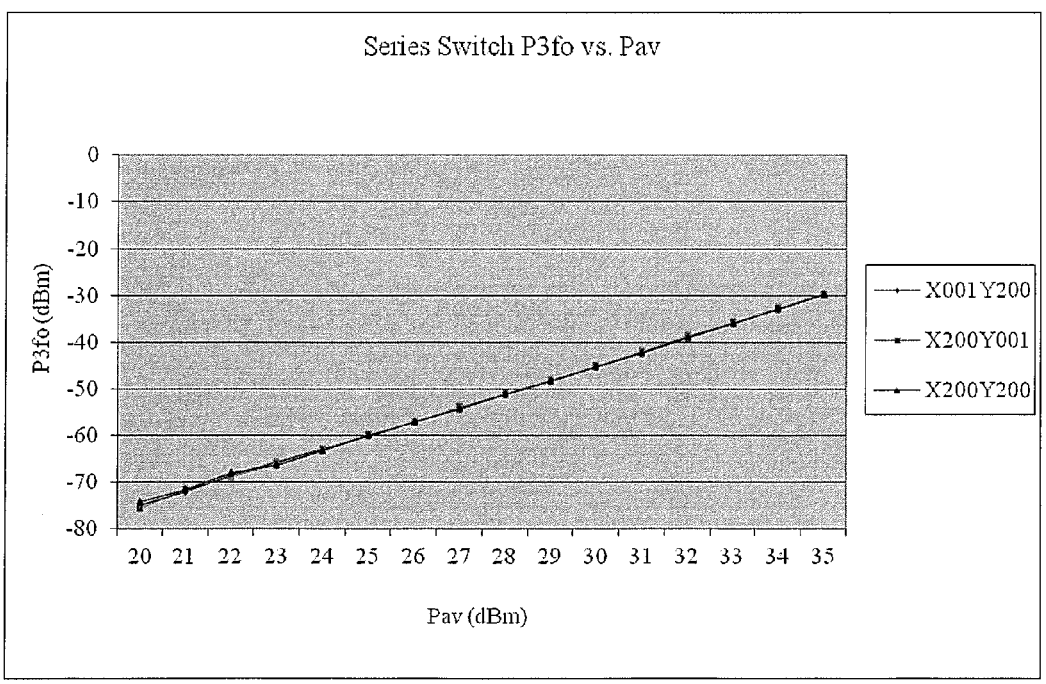

FIGS. 12 and 13 show performance graphs of the series switch according to aspects of the invention. To measure the performance of the series switch, a RF input power is injected into one of the stack, and the fundamental and harmonic power is measured at the load resistor. In FIGS. 12 and 13, the x-axis represents the power input and the y-axis represents the second and third harmonics, respectively, of the series switch. In FIG. 12, the series switch produces second harmonics at a power input of about 20 dBm. FIG. 12 further shows the second harmonics of the series switch steadily increasing as the power input is increased. As such, the harmonics produced by the series switch indicate a functional substrate. However, if the series switch does not produce harmonics, it would indicate that the substrate is defective. Accordingly, utilizing the series switch detects defective substrates prior to being delivered to a client, thus preventing manufacturing delays and returned products, and also provides additional space on the chip.

Similarly, in FIG. 13, the series switch produces third harmonics at a power input of about 20 dBm. FIG. 13 further shows the third harmonics of the series switch steadily increasing as the power input is increased. The steady increase of the harmonics in FIGS. 12 and 13 are a result of the series switch operating with no noise interference. As such, the harmonics produced by the series switch indicate a functional substrate. However, if the series switch does not produce harmonics, it would indicate that the substrate is defective. Accordingly, utilizing the series switch detects defective substrates prior to being delivered to a client, thus preventing manufacturing delays and returned products, and also provides additional space on the chip.

Figure 14:
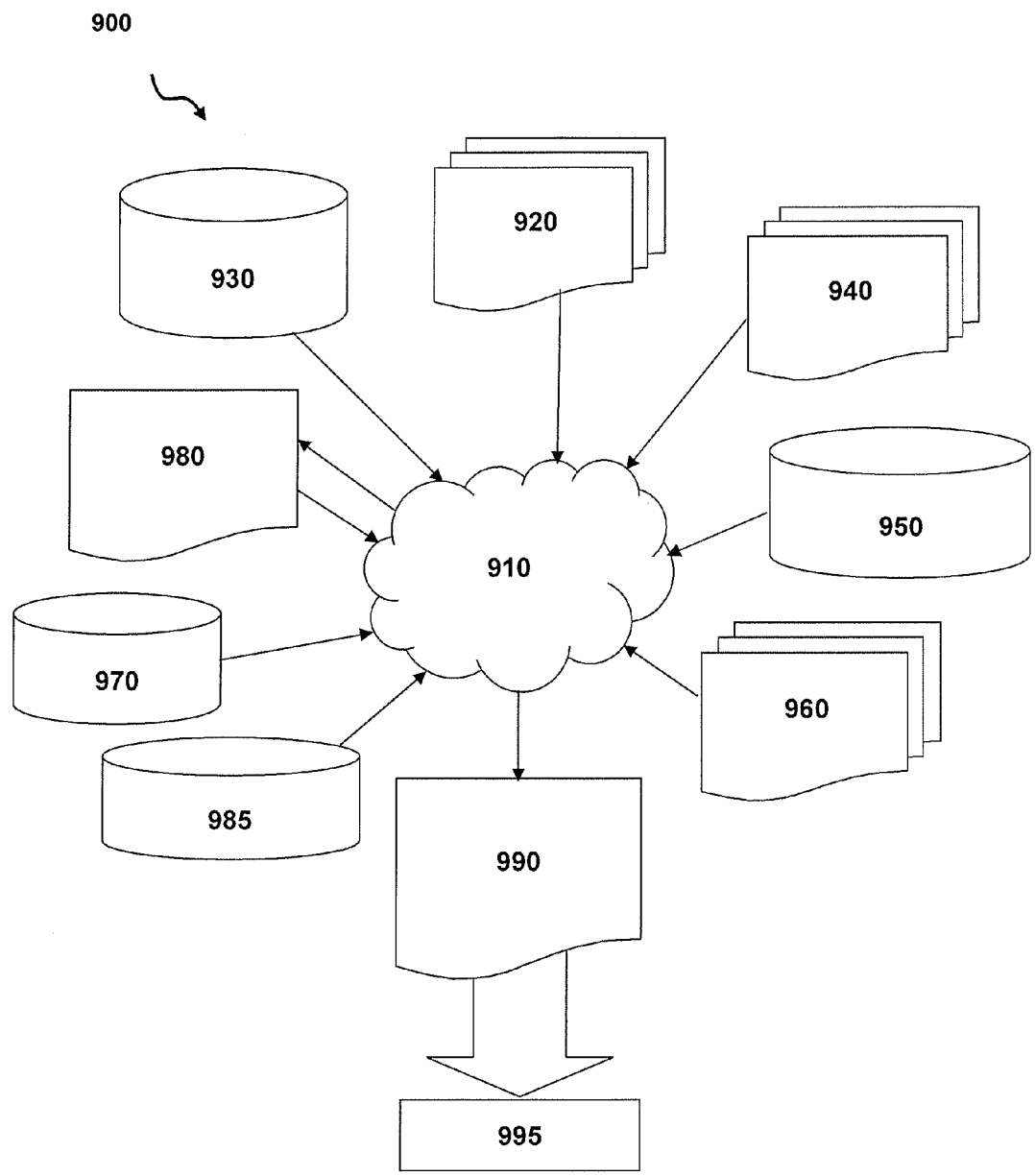
FIG. 14 is a flow diagram of a design process used in semiconductor design, manufacture, and/or test.

FIG. 14 is a flow diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 3, 6A, 6B, 7A, 7B, 8 and 9. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 14 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 3, 6A, 6B, 7A, 7B, 8 and 9. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 3, 6A, 6B, 7A, 7B, 8 and 9 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 3, 6A, 6B, 7A, 7B, 8 and 9. In one embodiment, design structure 990 may comprise a compiled, executable HDL simulation model that functionally simulates the devices shown in FIGS. 3, 6A, 6B, 7A, 7B, 8 and 9.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 3, 6A, 6B, 7A, 7B, 8 and 9. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. An integrated circuit having a structure comprising:
   a coplanar waveguide provided in a kerf of a wafer between a first chip and a second chip; and
   a shunt switch and a series switch coupled to the coplanar waveguide.

2. The integrated circuit of claim 1, wherein the shunt switch comprises:
   an RF signal generator connected to a load resistor and a ground; and
   a set of field effect transistors (FETs) in a stack connected to the RF signal generator, wherein:
     a source of a first FET in the stack is connected to the RF signal generator;
     drains of the FETs in the stack, except a last FET, are respectively connected to a source of a subsequent FET in the stack;
     a drain of the last FET in the stack is connected to the ground;
     gates of the FETs are individually connected to a respective resistor; and
     the respective resistors are connected to a gate bias.

3. The integrated circuit of claim 2, wherein the set of FETs in the stack comprises six FETs.

4. The integrated circuit of claim 2, wherein the set of FETs in the stack have a gate width of about 4 μm, wherein the gate width generates harmonics and fits within spatial limitations of the kerf.

5. The integrated circuit of claim 2, wherein the set of FETs in the stack has a width of about 5 μm in order to fit within the kerf.

6. The integrated circuit of claim 1, wherein the series switch comprises:
   an RF signal generator connected to a set of FETs in a stack and a ground GND; and
   a load resistor connected to a last FET of the set of FETs in the stack, wherein:
     the RF signal generator is connected to a source of a first FET of the set of FETs in the stack;
     drains of the FETs in the stack, except a last FET, are respectively connected to a source of a subsequent FET in the stack;
     a drain of a last FET of the set of FETs in the stack is connected to a load resistor;
     gates of the FETs are individually connected to a respective resistor; and
     the respective resistors are connected to a gate bias.

7. The integrated circuit of claim 6, wherein the set of FETs in the stack comprises six FETs.

8. The integrated circuit of claim 6, wherein the set of FETs in the stack have a gate width of about 1 μm, wherein the gate width increases coupling to a substrate and increases a sensitivity of harmonic tones.

9. The integrated circuit of claim 6, wherein the set of FETs in the stack has a width of about 5 μm in order to fit within the kerf.

10. The integrated circuit of claim 1, further comprising:
    a first set of a plurality of pads for testing the shunt switch; and
    a second set of a plurality of pads for testing the series switch.

11. The integrated circuit of claim 10, wherein the first set of the plurality of pads comprises:
    a first pad for a gate bias;
    a first set of ground pads separating the first pad and a second pad for an RF input;
    a second set of ground pads separating the second pad and a third pad for an RF output; and
    a third set of ground pads separating the third pad and a fourth pad for a body bias.

12. The integrated circuit of claim 10, wherein the second set of the plurality of pads comprises:
    a first pad for a gate bias;
    a first set of ground pads separating the first pad and a second pad for an RF input;
    a second set of ground pads separating the second pad and a third pad for an RF output; and
    a third set of ground pads separating the third pad and a fourth pad for a body bias.

13. A method comprising:
    applying a gate bias to a shunt switch and a series switch, both coupled to a coplanar waveguide within a kerf space of a wafer;

injecting an RF power into one end of the shunt switch and one end of the series switch; and measuring a fundamental power and a harmonic power at a load resistor of the shunt switch and a second load resistor of the series switch, while increasing the RF power.

14. The method of claim 13, wherein the fundamental power has a fundamental frequency and the harmonic power is measured at a second harmonic and a third harmonic.

15. The method of claim 13, wherein:
the shunt switch is measured in an off state; and
the series switch is measured in an on state.

16. The method of claim 13, wherein the fundamental and the harmonic power are measured using a 100 micron pitch probe or a 200 micron pitch probe.

17. A design structure tangibly embodied in a non-transitory machine readable storage medium for causing a machine to design, manufacture, or test an integrated circuit, the design structure comprising:
a coplanar waveguide provided in a kerf of a wafer between a first chip and a second chip; and
a shunt switch and a series switch coupled to the coplanar waveguide.

18. The design structure of claim 17, wherein the design structure comprises a netlist.

19. The design structure of claim 17, wherein the design structure resides on a storage medium as a data format for use in exchange of layout data of integrated circuits.

20. The design structure of claim 17, wherein the design structure resides in a programmable gate array.

* * * * *